US012613271B2

(12) United States Patent
Hraimel et al.

(10) Patent No.: US 12,613,271 B2
(45) Date of Patent: Apr. 28, 2026

(54) SYSTEMS AND METHODS FOR TESTING OPTICAL COMMUNICATION DEVICES

(71) Applicants: Bouchaib Hraimel, Milpitas, CA (US);
Zining Huang, Fremont, CA (US)

(72) Inventors: Bouchaib Hraimel, Milpitas, CA (US);
Zining Huang, Fremont, CA (US)

(73) Assignee: O-Net Communications Inc., San Jose,
CA (US)

( * ) Notice: Subject to any disclaimer, the term of this
patent is extended or adjusted under 35
U.S.C. 154(b) by 372 days.

(21) Appl. No.: 18/232,705

(22) Filed: Aug. 10, 2023

(65) Prior Publication Data

US 2024/0201249 A1 Jun. 20, 2024

Related U.S. Application Data

(63) Continuation of application No. 18/082,341, filed on
Dec. 15, 2022, now abandoned.

(51) Int. Cl.
G01R 31/28 (2006.01)

(52) U.S. Cl.
CPC ..... G01R 31/2867 (2013.01); G01R 31/2863
(2013.01); G01R 31/287 (2013.01); **G01R
31/2877** (2013.01)

(58) Field of Classification Search
CPC .............. G01R 1/07378; G01R 31/003; G01R
31/2874
See application file for complete search history.

(56) References Cited

U.S. PATENT DOCUMENTS

| | | | |
|---|---|---|---|
| 11,828,795 B1 * | 11/2023 | Jones ................. | G01R 31/2817 |
| 2008/0007285 A1 * | 1/2008 | Nakase .............. | G01R 31/2893 |
| | | | 324/756.07 |
| 2021/0021072 A1 | 1/2021 | Nelson | |

* cited by examiner

*Primary Examiner* — Tung X Nguyen
(74) *Attorney, Agent, or Firm* — PatentPC

(57) ABSTRACT

A test system for a device under test (DUT) includes an arm
to hold the DUT, the arm having a predetermined heat
capacity to act as a heat sink for the DUT; spring pins each
to secure the DUT pins to pads on a test board, each pin
supporting a 90 gigahertz bandwidth; and an actuator
coupled to the arm to align the DUT over a test board on a
horizontal X-axis and a vertical Y-axis, the actuator provid-
ing a compressive Z-axis force on the DUT to electrically
couple the DUT to the test board.

16 Claims, 1 Drawing Sheet

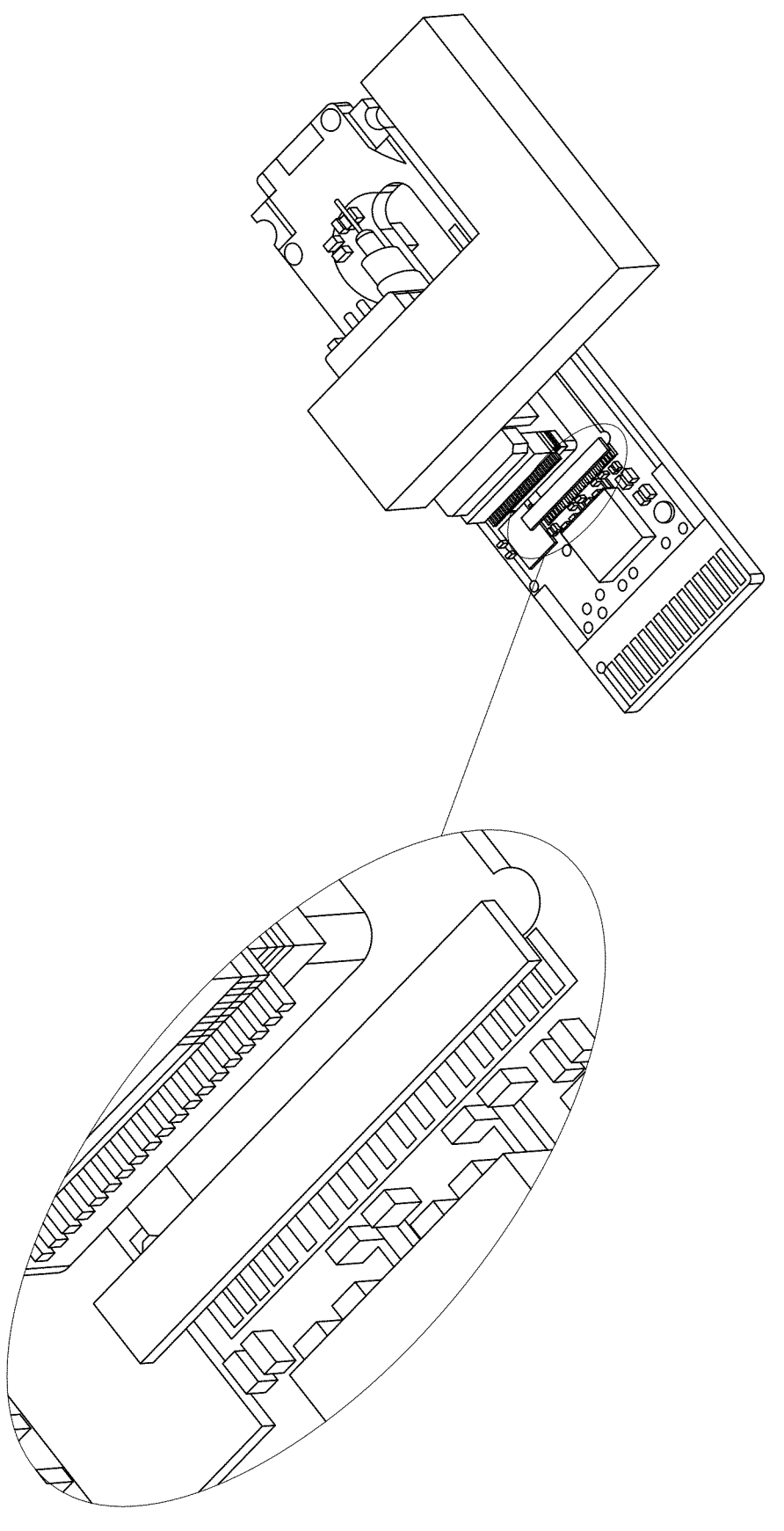

SYSTEMS AND METHODS FOR TESTING OPTICAL COMMUNICATION DEVICES

The present invention relates to systems and methods for testing integrated circuits.

Electronic components are an integral part the electronics industry. Typically, semiconductor chip testing involves making physical, electric contact between a probe, and the electronic component. This is also known as "DC coupling" or "wireline coupling."

Typically, the tester applies spring pins to electrically connect and integrated circuit (IC) being tested to a tester board. These springs are durable and reliable and are typically 5 mm-8 mm in length with a bandwidth around 10 GHz when used in an IC tester socket. These spring pins have high spring forces and don't put too much strain on the spring material. The bandwidth will increase to approximately 20 GHz if the spring pin length is cut to 3 mm. However, other specifications may be affected. The spring force, for example, might be decreased or the plunger travel may be restricted. The bandwidth can further be increased to about 30 GHz if the spring pin length is reduced to 1.5 mm. This length presents many manufacturing and mechanical challenges that can be difficult to overcome. These spring pins can be expensive to make due to the small size of the components and the materials they are made from. The increasing need for device performance drives increased bandwidth during testing. Yet the cost of testing needs to be kept low.

SUMMARY

A high-speed test fixture for a non-destructive test of packaged optical transmitter (TOSA) or receiver (ROSA) also for BGAs components is disclosed. The high-speed fixture includes one mechanical arm that holds the Device under Test (DUT) and an interposer for high speed and DC electrical signals. The mechanical arm holding the DUT also serves as heat sinker for the DUT. A high precision positioner is used for manual or automatic control of the X- and Y-alignment of the DUT pads to the corresponding test board pads. The interposer allows a direct high-speed electrical connection between the pads of the DUT and the Test board.

In one embodiment, the interposer is the Pariposer from Paricon Technologies that can go up to 90 GHz. The alignment could be manual using micro-positioner or automatic using an imaging system.

Advantages of the system may include one or more of the following. The test fixture can test the DUT without compromising its high-speed performance of the DUT and with no permanent mounting such as soldering. This way the DUT can be tested and if it fails, it can be easily removed with no de-soldering or rework that risks damaging the DUT and Test board. The test board can be reused many times and the DUT won't be damaged, which increases the yield in production. The system can minimize performance compromises while also minimize manufacturing costs.

BRIEF DESCRIPTION OF THE DRAWINGS

These and other features will become more apparent from the following description in which reference is made to the appended drawings, the drawings are for the purpose of illustration only and are not intended to be in any way limiting, wherein:

FIG. 1 is a block diagram of a first embodiment of an apparatus for testing an electronic component.

DETAILED DESCRIPTION

In the following description, for purposes of explanation, numerous specific details are set forth in order to provide an understanding of one of the embodiments of the inventive subject matter. However, it will be apparent to those skilled in the art that embodiments of the inventive subject matter may be practiced without these specific details. In general, well-known instruction instances, structures and techniques have not necessarily been shown in detail.

The technical solution of the present invention will be clearly and completely described with reference to the accompanying drawings. In the description of the present invention, it should be noted that the terms "center", "upper", "lower", "left", "right", "vertical", "horizontal", "inner", "outer", and the like indicate orientations or positional relationships based on the orientations or positional relationships shown in the drawings, and are only for the convenience of description and simplification of description, but do not indicate or imply that the device or element referred to must have a specific orientation, be constructed and operated in a specific orientation, and thus, should not be construed as limiting the present invention. Furthermore, the terms "first," "second," and "third" are used for descriptive purposes only and are not to be construed as indicating or implying relative importance.

FIG. 1 shows a block diagram of a high-speed test fixture system for testing an optical-electronic component. The high-speed test fixture enables non-destructive testing of a packaged optical transmitter (TOSA) or receiver (ROSA), and the system can also test BGA components. The high-speed fixture includes one mechanical arm that holds the Device under Test (DUT) and an interposer for high-speed and DC electrical signals. The mechanical arm holding the DUT also serves as a heat sink for the DUT.

In one embodiment, short spring pins (uncompressed length between 1.5 mm and 5-8 mm) are used to secure the DUT pins to the test board pads prior to running performance tests on the DUT. The pin features a bleed hole at the bottom tip of the bottom plunger. The location of the bleed hole at the bottom tip of the plunger is much easier than a side hole and allows for faster plating. If there are any residual burrs near the plunger, the hole can cause damage to the PCB pad. A slight chamfer at the entrance to the blind hole reduces the chance of a burr. This creates a contact surface at the bottom that looks like a volcano, but with an annular surface. A volcano rim is more damaging to the PCB pads than a spherical tip. However, it will still provide high-pressure contact against the PCB pad for a low resistance. Because a volcano rim is more flexible in allowing alignment errors in the socket, a single contact geometry such as spherical tips might be lost at the edge of the pad. However, a circular geometry will be more likely to strike a section of the pad if misaligned. The spring pin-based electrical interconnect system includes a non-conductive socket body, a spring pin located in part in the socket body and defining two ends, an anisotropically-conductive elastomeric sheet with first and second opposed surfaces, wherein the first surface is in contact with a first end of the spring pin, and a PCB in contact with the second surface of the elastomeric sheet. The spring pin, for example, consists of a top plunger, a bottom plunger, and an exterior spring. The socket body is a cavity that houses the spring pin. The socket body cavity is the location of the flange. In this example, the bottom and top plungers each have a flange. The top plunger has a flange in the socket cavity and the bottom plunger has a flange on the elastomeric sheets. The elastomeric sheets are designed to allow for an electrical connection between the spring pin and the electrical contact on the PCB. The top plunger creates an electrical contact at one side and a plunger at the opposing end. A bottom barrel element defines a cavity with an open bottom, where the plunger from the top plunger elements can be found and able to move upwards and downwards within the cavity. This spring pin-based electric interconnect system uses very short spring pins to achieve extremely high bandwidths while still maintaining substantial vertical compliance when using traditional spring-pin manufacturing methods. The result is a high performance interconnect that can be easily assembled and manufactured at a low cost.

A high precision positioner is used for manual or automatic control of the X- and Y-alignment of the arm holding the DUT so that it can be positioned over the corresponding test board pads. The interposer allows a direct high-speed electrical connection between the pads of the DUT and the Test board. In one embodiment, the interposer is the Pariposer from Paricon Technologies that can go up to 90 GHz. The interposer is an electrical interface routing between one socket and connection to another. The purpose of an interposer is to spread a connection to a wider pitch or to re-route a connection to a different connection, using RDL or Redistribution layers. The interposer enables an IC die to be connected to BGA or Micro-BGA, using different interconnect techniques.

Interposers can be designed using either Organic Substrates such as FR4, Rogers, Polyimide or other relevant materials, or using In-Organic Substrates such as Gallium Arsenide (Ga As), Gallium Nitride (GaN), Silicon Carbide (SiC) or similar. C2 and C4 are interposers that connect a small die in a FCBGA using Flip Chip on one side of the substrate BGA on the other side.

The alignment could be manual using a micro-positioner or automatic using an imaging system. The arm can be mounted on a 3D actuator. For example, the DUT is placed in a holder. The micro-positioner can be used to place the DUT to the test board. After placement, the DUT can be kept on the board using a compressive Z-force, but alternatives can be used such as temporary glue, adhesive, solder or temporary adhesive.

The micro-positioner can be calibrated beforehand to ensure precise placement. Some machines also use imaging systems (eg CCD, CMOS camera) to ensure precise placement of components. Although these methods improve accuracy, they lack feedback-based optimization for placing optic components (eg lenses, fibers or gratings), which may require high accuracy in order to work correctly. Some optical components have specific losses. Incorrect placement can result in optical losses (e.g., incorrect alignment of butt-coupled fibres), which could cause the device to malfunction when it kicks in. Additionally, some optical devices have operational characteristics (eg, polarization-sensitive PICs) that can further exacerbate the difficulty of accurately placing an optical component on an optical device during the testing phase done at the end of the manufacturing stage. A computer vision-based positioner can be optimized to place optical components based on error feedback signals.

A self-calibrating optical picking-and-place machine may have an optical placement controller system that can self-calibrate the optical placement system. This allows for the subsequent placement of optical parts using active alignment. The light passes through it and is coupled between the optical part and the optical device. One example embodiment of an optical pick-and place machine is equipped with a light source to provide light for active alignment. It can also detect in a loopback mode which can be used for generating a baseline value that can be used for precise optical placement.

A loopback mode can be used when an optical switch couples the photodetector to the light source. The optical placement controller system uses the measured light as a reference value or baseline. An optical switch connects a light source and a placement head to initiate active alignment mode. This directs light towards an optics device (e.g., the device or board on which the components are located) in order to activate the mode. The optical switch configures the placement device to receive light from an optical DUT device, and then inputs that light to the photodetector. Active alignment is when light is injected into an optical device and received by it. The voltage control signal generated by a photodetector indicates the optical power level. The voltage control signal can be received by the arm and used as a control loop to optimize the optical coupling between the component being placed and the optical device where it is placed. A pick-and-place device may, for example, move the optical assembly to be placed in one or more dimensions (eg via one or multiple rotations) until the highest level of optical power is achieved (eg by photodiode (body voltage signal indication) command).

The test board contains test drivers to test the DUT. Electrical signals are used to transmit or receive information in the form of bits. When the electronic equipment is interfaced with fiber optic networks, transceivers are used. Transceivers provide the conversion of electrical signal to optical signal and vice versa. Transceivers are an important component of any network. The test board can verify functionality of transceivers such as:

Transmitter Optical Sub Assembly (TOSA)
Receiver Optical Sub Assembly (ROSA)
Bi-Directional Optical Sub Assembly (BOSA)

The TOSA is the component inside the transceiver which is responsible for converting the electrical signal into an optical signal and then transmitting it over the optical fiber strand connected to it. The transmitter optical sub assembly consists of an electrical connection, a monitor photodiode, a laser diode, a housing which can be of metal or plastic and an optical interface.

The ROSA is the other component in the transceiver. The ROSA is responsible for receiving the optical signal transmitted by the TOSA of the opposite end's transceiver and converting it back to an electrical signal so that the communication equipment can understand it. The Receiver optical sub assembly consists of a photodiode, a housing and the electrical interface. The Photodiode receives the optical signal, the housing provides the metal or plastic cover and the electrical interface connects to the communication equipment. The ROSA is also an essential component of every fiber optic transceiver. A pair of TOSA and ROSA combined together forms the optical transceiver. The ROSA may also contain amplifier to enhance the received signal.

TOSA and ROSA are essential components in the uni-directional transceivers which transmit on one fiber optic strand and receive on the other fiber optic strand. In case of bi-directional transceivers, BOSA is used which is a combination of a TOSA, a ROSA and additionally a WDM filter. The WDM filter enables the bi-directional transceiver to split the wavelengths into two separate wavelengths. After the wavelengths are split, transmit and receive functions can work on a single strand of fiber.

In addition to the optical transceivers, the present system can also test BGA ICs by securely pressing the DUT in the Z-direction to the test board.

Although the present invention has been described in detail with reference to the foregoing embodiments, it will be apparent to those skilled in the art that modifications may be made to the embodiments described in the foregoing embodiments, or equivalents may be substituted for elements thereof. Any modification, equivalent replacement, or improvement made within the spirit and principle of the present invention should be included in the protection scope of the present invention.

As apparent from the above description and FIG. 1, the present system provides a test structure that can be finely controlled to electrically connect the DUT to the test board and allows greater than 90 GHz bandwidth for high-speed testing purposes and the structure also removes heat from the DUT. The fabricated probe structure satisfies the high density, the uniformity of size, height, and spacing, and the integration of elements. Therefore, the system solves conventional problems such as the long setup time of the DUT test structure, avoidance of the need to solder the pins of the DUT to the test board, ease of finely controlling the structure of the DUT contact structure, complexity of the whole process, mechanical instability of the products, and difficulty in uniformly assembling and testing the DUT interconnect structures. Additionally, the test structure of the present invention solves several problems caused in the actual testing step of the semiconductor devices, for instance, small-scale of the testing process for the semiconductor device, long testing time of the semiconductor device, difficulty in performing the contact between the pin structure and the semiconductor device, and having to specially design the test pads for the semiconductor device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A test system for a device under test (DUT), comprising:
an arm to hold the DUT, the arm having a predetermined heat capacity to act as a heat sink for the DUT;
spring pins each to secure the DUT pins to pads on a test board, each pin supporting at least a 90 gigahertz bandwidth, wherein the spring pin comprises a top plunger element defining an electrical contact at one end, and a plunger at an opposed end; and
an actuator coupled to the arm to align the DUT over a test board on a horizontal X-axis and a vertical Y-axis, the actuator providing a compressive Z-axis force on the DUT to electrically couple the DUT to the test board.

2. The system of claim 1, wherein the spring pin comprises a top plunger element defining an electrical contact at one end, and a plunger at an opposed end.

3. The system of claim 1, wherein the actuator comprises a micro-positioner.

4. The system of claim 1, wherein the actuator comprises a video camera for optical placement of the DUT.

5. The system of claim 4, comprising means for positioning the arm based on a video feedback loop.

6. The system of claim 1, wherein the DUT comprises a laser device and wherein the arm comprises a predetermined heat capacity to cool the DUT during testing.

7. The system of claim 1, comprising test signal generator coupled to at least one of the pins to provide an input stimulus.

8. The system of claim 1, wherein the DUT comprises a Transmitter Optical Sub Assembly (TOSA), a Receiver Optical Sub Assembly (ROSA), or a Bi-Directional Optical Sub Assembly (BOSA).

9. The system of claim 1, wherein the DUT comprises a ball-grid-array (BGA) device.

10. The system of claim 1, comprising a force sensor to detect the Z-axis force on the DUT and the test board.

11. A method to test for a device under test (DUT), comprising:
securing the DUT to an arm having a predetermined heat capacity to act as a heat sink for the DUT;
moving the arm to align the DUT over a test board on a horizontal X-axis and a vertical Y-axis with an actuator;
positioning the arm based on a video feedback loop; and
applying a compressive Z-axis force on the DUT to electrically couple the DUT to a test board with flexible pins to secure the DUT pins to pads on the test board, each pin supporting at least a 90 gigahertz bandwidth.

12. The method of claim 11, wherein the spring pin comprises a top plunger element defining an electrical contact at one end, a plunger at an opposed end.

13. The method of claim 11, wherein the actuator comprises a micro-positioner.

14. The method of claim 11, wherein the actuator comprises a video camera coupled to the actuator, comprising performing computer vision for optical placement of the DUT over the test board.

15. The method of claim 14, comprising positioning the arm based on a video feedback loop.

16. The method of claim 11, wherein the arm comprises a predetermined heat capacity to cool the DUT.

* * * * *